United States Patent [19]

Murao

[11] Patent Number: 4,795,971
[45] Date of Patent: Jan. 3, 1989

[54] DEVICE FOR DETECTING VOLTAGE FLUCTUATION

[75] Inventor: Eiji Murao, Saitama, Japan

[73] Assignee: Honda Giken Kogyo Kabushiki Kaisha, Tokyo, Japan

[21] Appl. No.: 734,572

[22] Filed: May 15, 1985

[51] Int. Cl.$^4$ .................. G01R 19/00; H03K 5/153
[52] U.S. Cl. .................. 324/102; 324/76 R; 324/119; 328/147; 328/148
[58] Field of Search .......... 324/102, 119, 61 P, 324/61 R, 60, 311, 76; 328/132, 146, 147, 152; 307/152, 357; 340/661, 557

[56] References Cited

U.S. PATENT DOCUMENTS

| | | | |
|---|---|---|---|
| 2,564,829 | 8/1951 | Bedford et al. | 324/119 |
| 3,988,726 | 10/1976 | Reiss et al. | 340/567 X |
| 4,449,058 | 5/1984 | Feldmann | 307/152 |
| 4,507,578 | 3/1985 | Matsuda | 307/358 X |
| 4,507,795 | 3/1985 | Wagner | 328/147 |

*Primary Examiner*—Ernest F. Karlsen
*Assistant Examiner*—Vinh P. Nguyen
*Attorney, Agent, or Firm*—Lyon & Lyon

[57] ABSTRACT

A device for detecting voltage fluctuation including a first amplifier for amplifying an input voltage signal, a second amplifier for amplifying the same input voltage signal with a fixed delay time relatively to the first amplifier and a voltage comparator for comparing the respective amplified output voltages to produce a high-level output at the time of increase or decrease of the input voltage signal.

3 Claims, 3 Drawing Sheets

DEVICE FOR DETECTING VOLTAGE FLUCTUATION

BACKGROUND OF INVENTION

1. Field of the Invention

The present invention relates to a voltage fluctuation detecting device for detecting state of increase and decrease of D.C. voltage signal.

2. Prior Art

Heretofore, in order to detect fluctuation of D.C. voltage signal it has been necessary to firstly measure a voltage value and then detect the fluctuation of the measured voltage value, so that a complicated circuit construction has been required to effect the detection of voltage fluctuation. In some system, such measurement of voltage value is not always necessary as a means for controlling the system and it is enough to detect whether the state of fluctuation of the input voltage is in increasing process of decreasing process.

OBJECT OF THE INVENTION

In view of the circumstances as described above, it is an object of the present invention to provide a voltage fluctuation detecting device which is in simple in construction and which enables to easily detect whether the state of voltage fluctuation is in increasing process or decreasing process.

SUMMARY OF THE INVENTION

In accordance with the present invention there is provided a device for detecting voltage fluctuation comprising a first amplifier for amplifying an input voltage signal, a second amplifier for amplifying the same input voltage with a fixed delay time relatively to said first amplifier, said first and second amplifiers having a same gain with each other, and a voltage comparator for comparing the respective amplified output voltages, thereby producing a high-level output at the time of increase or decrease of the input voltage signal.

BRIEF DESCRIPTION OF THE DRAWINGS

Now, the invention will be explained with reference to the drawings, in which.

DESCRIPTION OF THE PREFERRED EMBODIMENT

Now, an embodiment of the present invention will be explained in detail with reference to the accompanying drawings.

Figure 1:
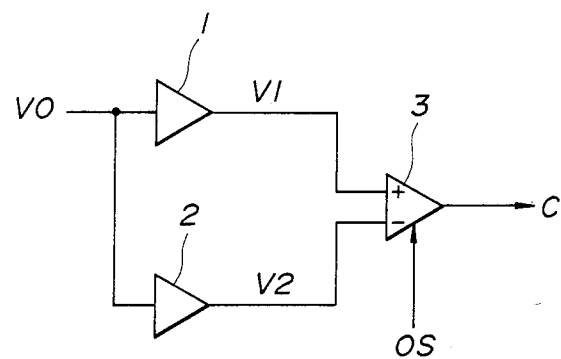
FIG. 1 is a block diagram showing an embodiment of the voltage fluctuation detecting device according to the present invention.

FIG. 1 illustrates an embodiment of the voltage fluctuation detecting device according to the present invention which is applied to the detection of the state of increase of D.C. voltage signal. The device shown in FIG. 1 is constructed of a first amplifier 1 for amplifying an input D.C. voltage signal Vo, a second amplifier 2 for amplifying the same input D.C. voltage signal Vo with a fixed delay time relatively thereto and a voltage comparator 3 for comprising the amplified output voltages V1 and V2. The amplifiers 1 and 2 have a same gain to each other. The comparator 3 is applied with an offset voltage which is so adjusted that it produces a low level output when $V1 \leq V2$ and a high level output when $V1 > V2$. OS indicates the offset signal applied to the voltage comparator 3.

Figure 2:
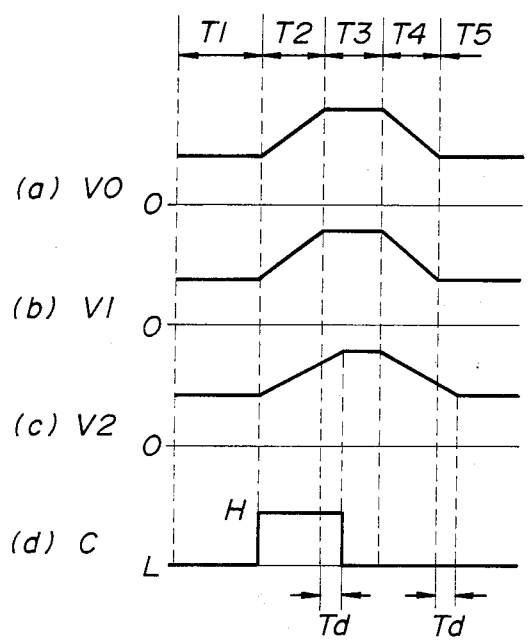
FIG. 2 is a time chart showing the timing of signals at several parts of the embodiment shown in FIG. 1.

In the construction as described above, when the input voltage signal Vo varies, as shown in FIG. 2(a), the output voltage V1 of the amplifier 1 becomes a signal which varies in synchronized relation with the input voltage signal Vo, as shown in FIG. 2(b) and the output voltage V2 of the amplifier 2 becomes a signal which completes its increase and decrease with a delay time Td relatively to the input voltage signal Vo, as shown in FIG. 2(c). During the period T1 where the input voltage signal Vo produces no variation, the output voltages V1 and V2 of the amplifiers 1 and 2 become equal to each other, so that the output of the voltage comparator 3 becomes a low-level signal. During the period T2 where the input voltage signal Vo is increasing, the output voltage V1 of the amplifier 1 increases in synchronized relation with the input voltage signal Vo, while the output voltage V2 of the amplifier 2 increases with a fixed delay time relatively thereto. Accordingly, during the period T2, the relation $V1 > V2$ is constantly maintained, so that the output of the voltage comparator 3 becomes a high-level signal. During the period T3 where the input voltage signal Vo is held constant, without producing any variation, the output voltage V1 of the amplifier 1 is held in synchronized relation with said input voltage signal, so that it is held in constant state. During the beginning of Td period, the output voltage V2 of the amplifier 2 is still in the increasing state owing to the delay operation, so that $V1 > V2$ during this beginning of said Td period and consequently the output of the voltage comparator 3 becomes a high-level signal. After the lapse of the Td period, the output voltage V2 of the amplifier 2 becomes constant, so that $V1 = V2$ and consequently the output of the voltage comparator 3 becomes a low-level signal. During the period T4 where the input voltage signal Vo is decreasing, the output voltage V1 of the amplifier 1 decreases in synchronized relation to the input voltage signal Vo, while the output voltage V2 of the amplifier 2 decreases with a fixed delay time relatively to V1. Accordingly, the relation $V1 < V2$ is constantly held during this period T4, so that the output of the voltge comparator becomes a low-level signal. During the period T5 where the input voltage signal Vo is held constant, the output voltage V2 of the amplifier 2 is still in decreasing state at the beginning of the Td period owing to the delay operation, so that $V1 < V2$ during the beginning of the Td period and consequently the output of the voltage comparator 3 becomes a low-level signal. After the lapse of the Td period, $V1 = V2$, so that the output of the voltage comparator 3 is held at the low-level. Accordingly, the voltage comparator 3 produces a two-value output signal C which varies as shown in FIG. 2(d) in accordance with the fluctuation of the input voltage signal Vo.

Thus the voltage fluctuation detecting device according to the present invention makes it possible to detect the increasing state of the fluctuation of the input voltage signal Vo, by detecting the state where the output of the voltage comparator 3 is at high level. The device according to the present invention further makes it possible to effect the detection at higher sensitivity, by setting the inverted differential voltage of the voltage comparator 3 at a lower value and also it makes it possible to eliminte the fine variation or the long period variation of the input voltage signal Vo by setting the delay time Td at an optimum value.

Figure 5:
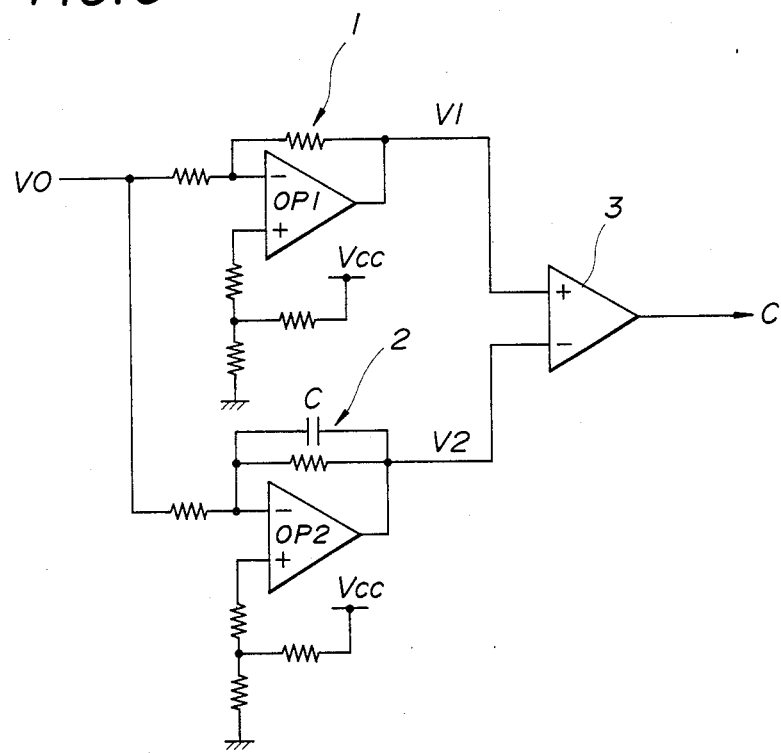
FIG. 5 is a circuit diagram showing an example of the detailed circuit of the device according to the present invention.

FIG. 5 illustrates an example of the detailed construction in which the each portion of the amplifiers 1 and 2 consists of an operational amplifier circuit. The operational amplifier OP2 includes a delay element C connected in parallel with a feedback resistor. In this circuit construction, an offset voltage of the voltage comparator 3 is omitted by properly selecting the offset voltages of the respective operational amplifiers OP1 and OP2.

Figure 3:
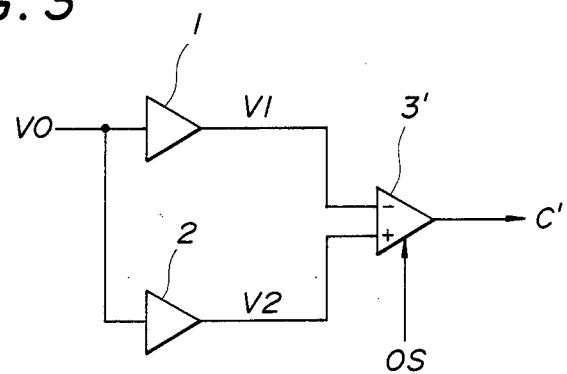
FIG. 3 is a block diagram showing another embodiment of the device according to the present invention.
Figure 4:
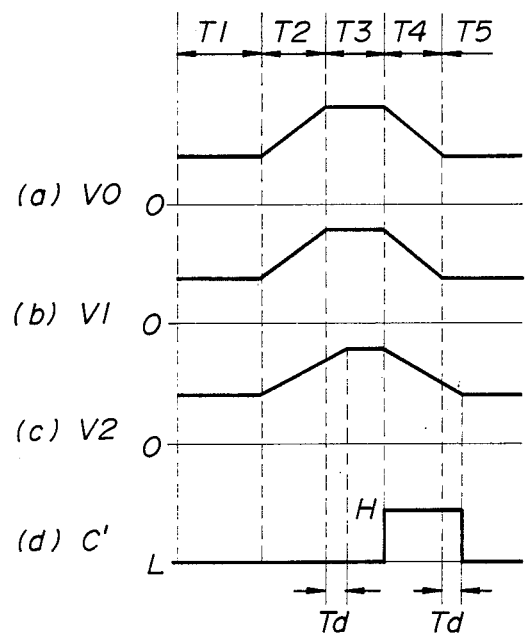
FIG. 4 is a time chart showing the timing of signals at several parts of the embodiment shown in FIG. 3.

FIG. 3 illustrates an embodiment of the voltage fluctuation detecting device according to the present invention which is applied to the detection of the state of decrease of D.C. voltage signal. In this case, the voltage comparator 3' is arranged to have an opposite polarity to that of the case shown in FIG. 1. In the case of FIG. 3, the voltage comparator 3' produces a low-level signal when $V1 \geq V2$, while it produces a high-level signal when $V1 < V2$, with the result that the voltage comparator 3' produces an output signal C' which has a high level only during the decreasing period T4 of the fluctuation of the input voltage signal Vo and the following Td period extending into the next period T5 according to the delay of the amplifier 2. Accordingly, it is possible to detect the decreasing state of the fluctuation of the input voltage signal by monitoring the output of the voltage comparator 3'.

Figure 6:
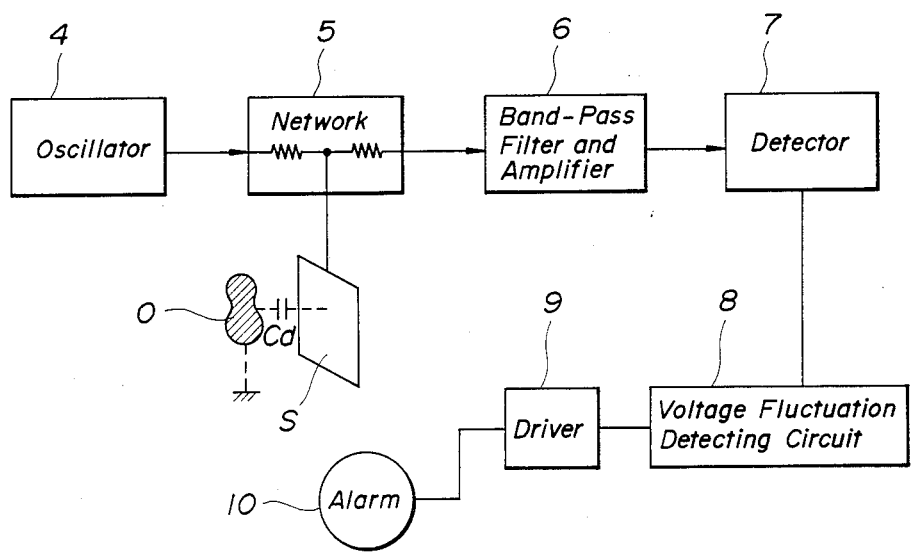
FIG. 6 is a block diagram showing an example of actual use of the voltage fluctuation detecting device according to the present invention.

FIG. 6 illustrates an example of the construction of the system in which the voltage fluctuation detecting device according to the present invention is applied to an object detecting system for detecting an object, such as an obstacle, during running of an automobile, for example. The device as illustrated in FIG. 6 includes an oscillator 4 for generating a fixed frequency signal, a network 5 consisting of a resistance dividing circuit arranged at the output side of said oscillator 4, as sensor S consisting of an electrode plate connected to the dividing point of said network 5, a band-pass filter and amplifier 6 for effecting filtering-off of noise an amplification of the high-frequency output voltage produced by said network 5, a detector 7 for effecting detection of the amplified output signal, and a voltage fluctuation detecting circuit 8 for detecting the approach of an object to the sensor S by detecting the state of decrease of the detected voltage signal and feeding an alarm signal to a driver 9 of an alarm 10 when the detected voltage signal is decreased beyond a predetermined level.

In the construction as described above, the floating capacity Cd between an object 0 and the sensor S is increased as the object 0 approaches the sensor S, so that the output frequency signal of the network 5 is attenuated. The state of decrease of the output voltage of the detector 7, depending upon the attenuation of said output frequency signal, is detected by the voltage fluctuation detecting circuit 8. If necessary, the alarm 10 is energized thereby, to provide a warning of the state of approach of the object.

Thus the present invention provides a superior voltage fluctuation detecting device which is simple in construction and which makes it possible to easily detect whether the fluctuation of D.C. voltge signal is in the increasing process or in the decreasing process.

I claim:

1. A device for detecting voltage fluctuation in a substantially D.C. input voltage signal comprising a first amplifier for amplifying said D.C. input voltage signal, a second amplifier for amplifying the same D.C. input voltage signal with a fixed delay time relative to the first amplifier, said first and second amplifiers having the same gain with respect to each other to produce two respective amplified output voltages, a voltage comparator for comparing the respective amplified output voltages, thereby producing a high-level output at the time of increase or decrease of said D.C. input voltage signal, and means for providing an offset voltage to the voltage comparator.

2. The device of claim 1 wherein the means for providing an offset voltage provides an offset voltage to cause the voltage comparator to produce a low level output when the second amplifier output voltage is equal to or greater than the first amplifier output voltage.

3. The device of claim 1 wherein the means for providing an offset voltage provides an offset voltage to cause the voltage comparator to produce a low level output when the first amplifier output voltage is equal to or greater than the second amplifier output voltage.

* * * * *